United States Patent
Becker et al.

(10) Patent No.: US 8,131,235 B2
(45) Date of Patent: Mar. 6, 2012

(54) RADIO RECEIVER FOR HYBRID BROADCAST SYSTEMS

(75) Inventors: Karl-Anton Becker, Karlsbad (DE); Philip Obergfell, Karlsbad (DE); Binh Ton That Giang, Karlsruhe (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 748 days.

(21) Appl. No.: 12/013,333

(22) Filed: Jan. 11, 2008

(65) Prior Publication Data
US 2008/0299926 A1 Dec. 4, 2008

(30) Foreign Application Priority Data
Jan. 11, 2007 (EP) .................................... 07000546

(51) Int. Cl.
*H04B 1/18* (2006.01)
(52) U.S. Cl. ................ 455/150.1; 455/161.2; 455/179.1
(58) Field of Classification Search .................. 455/140, 455/150.1, 160.1, 161.1–161.2, 179.1, 550.1
See application file for complete search history.

(56) References Cited

U.S. PATENT DOCUMENTS

| | | | |
|---|---|---|---|
| 5,809,065 A | 9/1998 | Dapper et al. | |
| 6,600,908 B1 | 7/2003 | Chan | |
| 7,088,740 B1 | 8/2006 | Schmidt | |
| 7,375,771 B2 * | 5/2008 | Naoi et al. | 348/732 |
| 2002/0126703 A1 * | 9/2002 | Kovacevic | 370/487 |

FOREIGN PATENT DOCUMENTS

| EP | 0669763 A2 | 8/1995 |
|---|---|---|
| EP | 1434371 A2 | 6/2004 |

* cited by examiner

*Primary Examiner* — Christian Hannon
(74) *Attorney, Agent, or Firm* — The Eclipse Group LLP (57) ABSTRACT

An example radio receiver and a method is provided for controlling a radio receiver having two tuners, and receiving a hybrid signal containing digital and analog broadcast signal components. According to the example method, a selection is made in the radio receiver to operate between at least the following operating modes of the receiver: (i) a first operating mode in which both tuners are tuned to the same broadcast hybrid signal and where one of the tuners is configured to receive the digital broadcast signal and the other tuner is configured to receive the analog broadcast signal; (ii) a second operating mode in which one of the tuners receiving the digital broadcast signal is the operating tuner and the other tuner is a search and check tuner; and (iii) a third operating mode in which one of the tuners receiving the analog broadcast signal is the operating tuner and the other tuner is a search and check tuner. In this example, the hybrid signal is received and the two tuners are controlled in accordance with the selected operating mode of the receiver.

21 Claims, 7 Drawing Sheets

RADIO RECEIVER FOR HYBRID BROADCAST SYSTEMS

RELATED APPLICATIONS

This application claims priority of European Patent Application Serial No. 07 000 546.7, filed on Jan. 11, 2007, titled RADIO RECEIVE FOR HYBRID BROADCAST SYSTEMS, which application is incorporated by reference in this application in its entirety.

BACKGROUND OF THE INVENTION

1. Field of the Invention

This invention relates generally to radio receivers, and more particularly to methods for controlling a radio receiver receiving a hybrid signal.

2. Related Art

Many modern radio receivers for mobile reception consist of two reception paths. One reception path is used to receive, demodulate and decode a program chosen by a user while the second path is utilized to gather information from other stations. For example, the second path may be used to generate a station list or to provide traffic information.

The use of the second reception path as described is often referred to as background reception. Many modern receivers include two tuners that may be individually tuned to different frequencies. The tuners may be connected to a signal processor that is capable of demodulating and decoding both received signals individually. Many modern radio receivers include a digital signal processor that is connected to the outputs of one analog-to-digital-converter for each output signal to the two tuners. The latter receiver architecture is often referred to as a "digital IF receiver."

To upgrade a digital IF receiver to be capable of receiving, demodulating and decoding the digital broadcast signal of a hybrid broadcast system, one of the tuners may be modified, for example, with additional filtering, and an additional signal processing path may be provided for reception of the digital broadcast signal. The additional signal processing path may be fed by the output signal of the A/D-converter connected to the modified tuner. In addition, a stage for the audio output of either the analog or the digital reception path can be chosen as output signal of the receiver (blending). In a receiver that has been modified as described, one tuner with its corresponding signal processing path is used for reception of the analog broadcast signal, and the other tuner with its corresponding signal processing path is used for reception of the digital broadcast signal of a hybrid broadcast system.

Since the modified receiver for a hybrid broadcast system includes the same hardware that is used by a normal dual receiver capable of background reception as described above, it would be desirable to use the existing receiver hardware for both purposes—reception of a hybrid broadcast signal and background reception—at the same time. This would eliminate the need for additional hardware (additional tuner and A/D-converter).

Radio receivers are often used in vehicles in combination with a navigation system guiding the user from a predetermined location to a certain destination. To calculate the fastest route to the destination, navigation systems often use information included in the received radio program containing data for traffic information that can be decoded by the receiver. The traffic information permits calculation of the fastest route to the desired destination avoiding closed or congested routes.

SUMMARY

In view of the above, an example method is provided for controlling a radio receiver having two tuners, and receiving a hybrid signal containing digital and analog broadcast signal components. According to the example method, a selection is made in the radio receiver to operate between at least the following operating modes of the receiver: (i) a first operating mode in which both tuners are tuned to the same broadcast hybrid signal and where one of the tuners is configured to receive the digital broadcast signal and the other tuner is configured to receive the analog broadcast signal; (ii) a second operating mode in which one of the tuners receiving the digital broadcast signal is the operating tuner and the other tuner is a search and check tuner; and (iii) a third operating mode in which one of the tuners receiving the analog broadcast signal is the operating tuner and the other tuner is a search and check tuner. In this example, the hybrid signal is received and the two tuners are controlled in accordance with the selected operating mode of the receiver.

In another aspect, an example radio receiver is configured to receive a hybrid signal containing digital and analog broadcast signal components. The receiver includes a first tuner adapted to receive the digital and the analog broadcast signals. A second tuner is adapted to receive the analog broadcast signal. At least one antenna is used to receive the hybrid signal. At least one signal processing unit is used for demodulating and decoding the analog and digital broadcast signals. The receiver includes an operating mode selection unit for controlling the two tuners and to select an operating mode of the receiver from between at least the following operating modes: (i) a first operating mode in which both tuners are tuned to the same broadcast hybrid signal, one of the tuners being configured for receiving the digital broadcast signal, the other tuner receiving the analog broadcast signal; (ii) a second operating mode in which one of the tuners receiving the digital broadcast signal is the operating tuner and the other tuner is a search and check tuner; and (iii) a third operating mode in which one of the tuners receiving the analog broadcast signal is the operating tuner and the other tuner is a search and check tuner.

Other devices, apparatus, systems, methods, features and advantages of the examples consistent with the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

Figure 1:
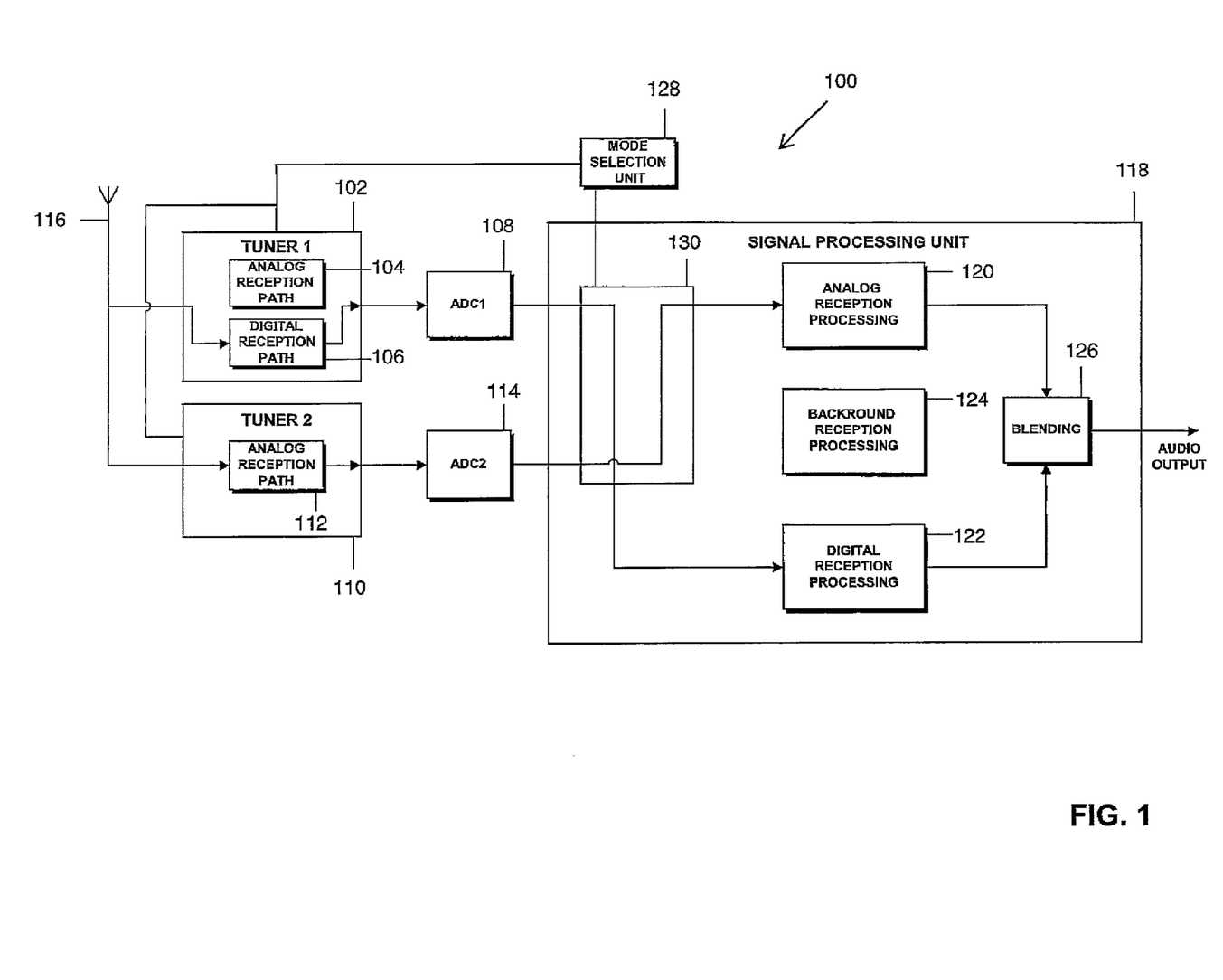
FIG. 1 is a block diagram of an example of a hybrid receiver operating in a first operating mode.

FIG. 1 is a block diagram of an example of a hybrid receiver 100 operating in a first operating mode. The radio receiver 100 is configured for receiving a hybrid broadcast signal comprising digital and analog broadcast signal components. By way of example, such a hybrid broadcasting system is known in the art as HD radio. The receiver 100 includes a first tuner 102 and a second tuner 110, which receive signals from at least one antenna 116. FIG. 1 shows a single antenna 116, however, more than one antenna may be provided. In examples in which the receiver 100 is incorporated within a vehicle, the receiver 100 may also be connected to two or more antennas located at different positions within the vehicle.

The first tuner 102 includes an analog reception path 104 and a digital reception path 106 to allow the first tuner 102 to receive analog and digital signal components. In the example shown in FIG. 1, the second tuner 110 includes one analog reception path 112. The signal output from the first tuner 102 is an analog signal that is coupled to a first analog-to-digital-converter ADC1 108. The ADC1 108 converts the analog signal to a digital signal for processing by a signal processing unit 118. The signal from the second tuner 110 is coupled to a second analog-to-digital-converter ADC2 114. The output of the ADC2 114 is also coupled to the signal processing unit 118. The signal processing unit 118 includes an analog reception processing module 120, a digital reception processing module 122 and a background reception processing 124. In the digital reception processing module 122, the digital broadcast signal received by the first tuner 102 and the digital reception path 106 is further processed, for example, by demodulating and decoding the digital broadcast signal. The analog reception processing module 120 processes the analog broadcast signal received from either the second tuner 110 or from the analog reception path 104 of the first tuner 102. The background reception processing module 124 does not process the received signals for the audio output. Rather, the background reception processing module 124 performs a search and check for receiving status searching for additional information included in the broadcast signal. The background reception processing module 124 may also search for other frequencies for the radio programs that can be received via the antenna 116.

A blending or switching module 126 receives each of the signals output from the analog reception processing module 120 and the digital reception processing module 122 and selects one of the two to be processed as an audio output signal. The receiver 100 shown in FIG. 1 includes an operation mode selection unit 128, which controls the first and second tuners 102, 110 and the switch 130, and also controls the selection of which of the signal is used for the audio output. The switch 130 couples the output of the first and second ADCs 108, 114 to the different reception processing modules 120, 122, 124.

The receiver 100 shown in FIG. 1 may operate according to at least three different operating modes. In a first operating mode, both the first and second tuners 102, 110 are tuned to the same frequency, and the first tuner 102 receives, if present, the digital broadcast signal, while the second tuner 110 receives the analog broadcast signal. Operation of the receiver 100 in the first operating mode is represented in FIG. 1. In a second operating mode, the first tuner 102 receives the digital signal component for use as the audio output. The second tuner 110 is used for the background reception processing. Operation of the receiver 100 in the second operating mode is described below with reference to FIG. 3. In a third operating mode, the first and second tuners 102, 110 both process signals on the analog reception paths 104, 112. One of the first or second tuner 102 or 110 may be the operating tuner and the other tuner 110 or 102 may be the background processing tuner as described below with reference to FIG. 4.

FIG. 1 illustrates operation of the receiver 100 in the first operating mode. The first operating mode may be used when the receiver is tuned to a new frequency. Both the first and second tuners 102, 110 are tuned to the same frequency. The first tuner 102 is configured to receive the digital broadcast signal. The output of the first tuner 102 is coupled to the first ADC 108, which then converts the analog signal to a digital signal and transmits the digital signal to the digital reception processing module 122. The output signal of the second tuner 110 is coupled to the signal processing unit 118 via the second ADC 114 for demodulating and decoding the analog broadcast signal. The processing of the digital broadcast signal generally takes longer so that, at first, the audio signal of the analog reception path may be output first. The analog signal is received via the second tuner 110 because the first tuner 102 is modified to receive the digital signal component in this operating mode. Use of the first tuner 102 may degrade the analog reception performance.

As soon as the digital signal is acquired and an audio output from the digital reception processing module 122 becomes available, the audio output of the receiver 100 will be blended to the digital audio signal. When a digital audio signal has been received and decoded, the receiver 100 may change the operating mode to the second operating mode, which is described with reference to FIG. 3.

Figure 3:
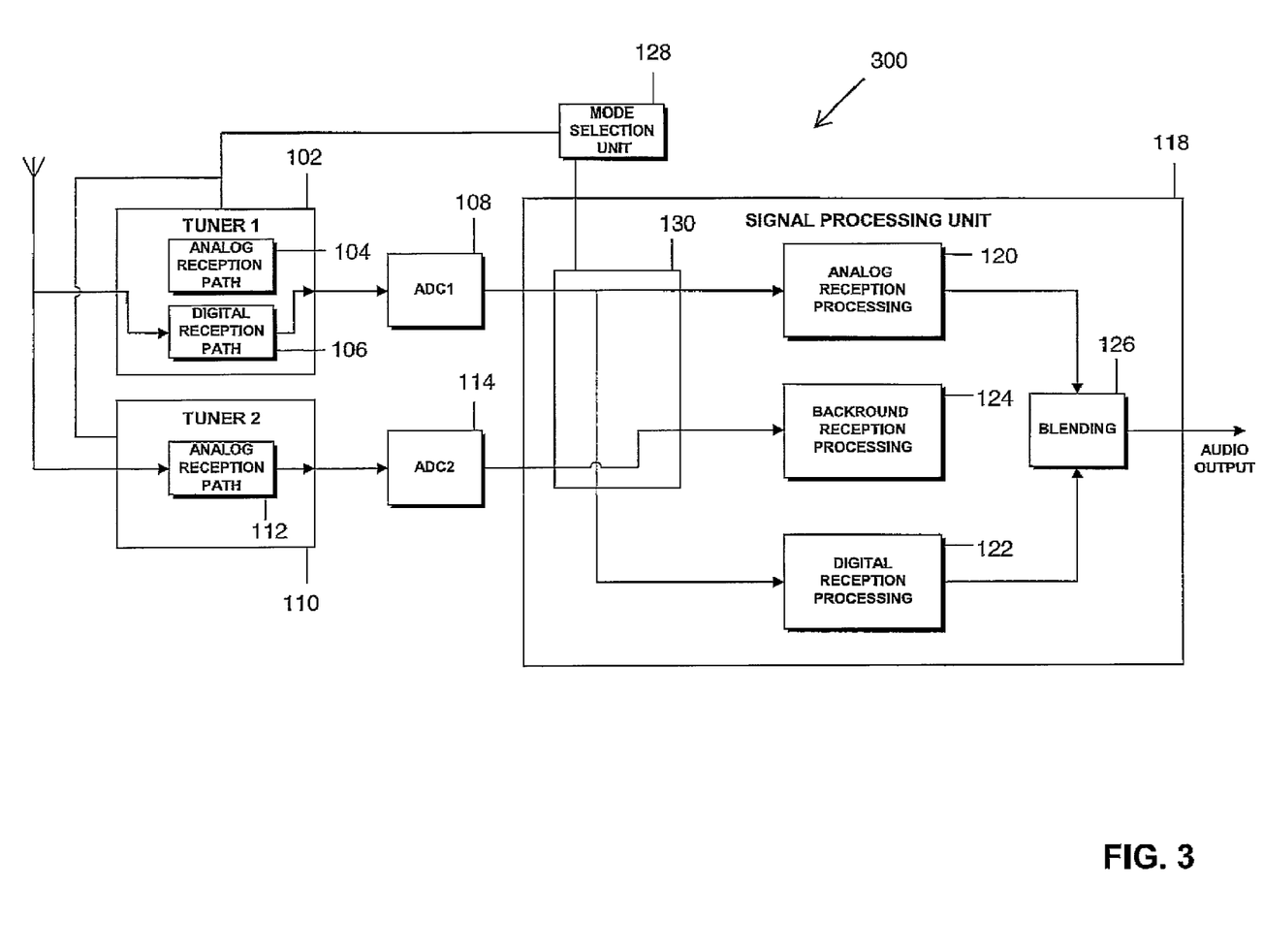
FIG. 3 is a block diagram of the example hybrid receiver operating in a second operating mode.

FIG. 3 is a block diagram of the example hybrid receiver operating in a second operating mode. In FIG. 3, the receiver 100 is shown as a receiver 300 in an operating state in which the digital broadcast signal is used for the audio output. The components in the receiver 300 are identified by the same reference numerals as the corresponding components in the receiver 100 in FIG. 1. The example of the receiver 300 in FIG. 3 differs from the receiver 100 in FIG. 1 in that the switch 130 is set to couple the signal received from the first tuner 102 to the analog reception processing module 120 and the digital reception processing 122. The second tuner 110 is used for the background reception via the connection of the second ADC 114 to the background reception processing modules 124. The output signal of the first tuner 102 is also coupled to the analog reception processing module 120 via the first ADC 108 for demodulating and decoding of the analog broadcast signal. If the reception quality of the digital signal component worsens and audio output from the digital reception path 106 becomes unavailable, the receiver 300 may blend back to the audio output of the analog broadcast signal received via the first tuner 102. A control unit (not shown) may be configured to ensure that the loss of digital audio output is detected sufficiently fast to avoid noticeable degradation of the reception quality because the analog broadcast signal is received via the first tuner 102 at that point.

Figure 4:
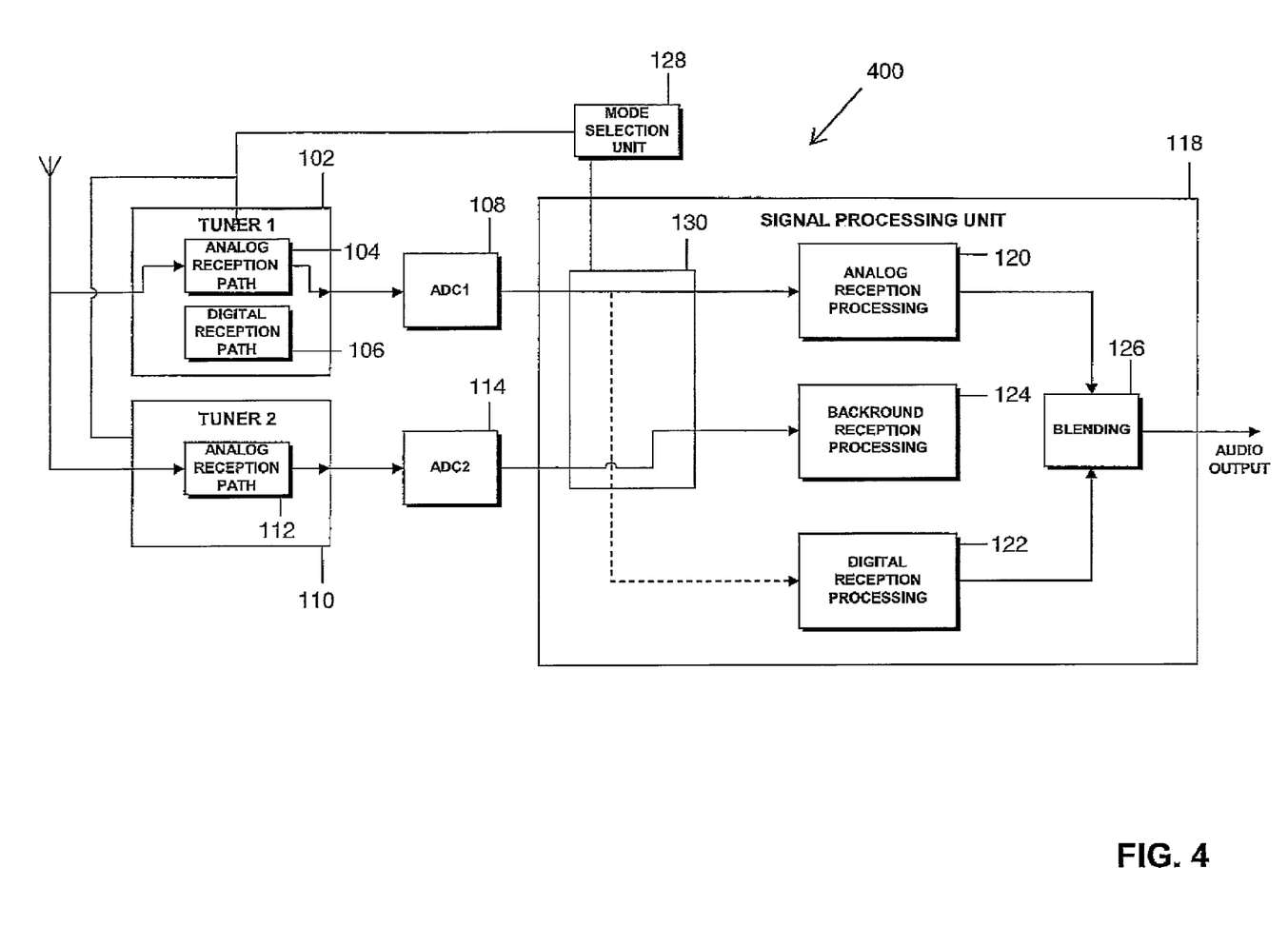
FIG. 4 is a block diagram of the example hybrid receiver operating in the third operating mode.

FIG. 4 is a block diagram of the example hybrid receiver operating in the third operating mode. When no digital signal component can be received, the receiver 100, 300 may switch to operate as a receiver 400 in a third operating mode as shown in FIG. 4. The receiver 400 in FIG. 4 corresponds to the receiver 100 in FIG. 1 and receiver 300 in FIG. 3 with the following differences. First, the analog reception path 104 in the first tuner 102 is used. Second, the output of the first tuner 102 is used for the audio output. Third, the second tuner 110 is used for the background reception processing. In the third operating mode, the receiver 400 operates as a typical dual tuner receiver where the first tuner 102 is configured for optimum reception quality, while the second tuner is used for background reception. The switch 130 includes a dashed arrow illustrating that the signal output of the first tuner 102 may be transmitted by the digital reception processing module 122.

Figure 2:
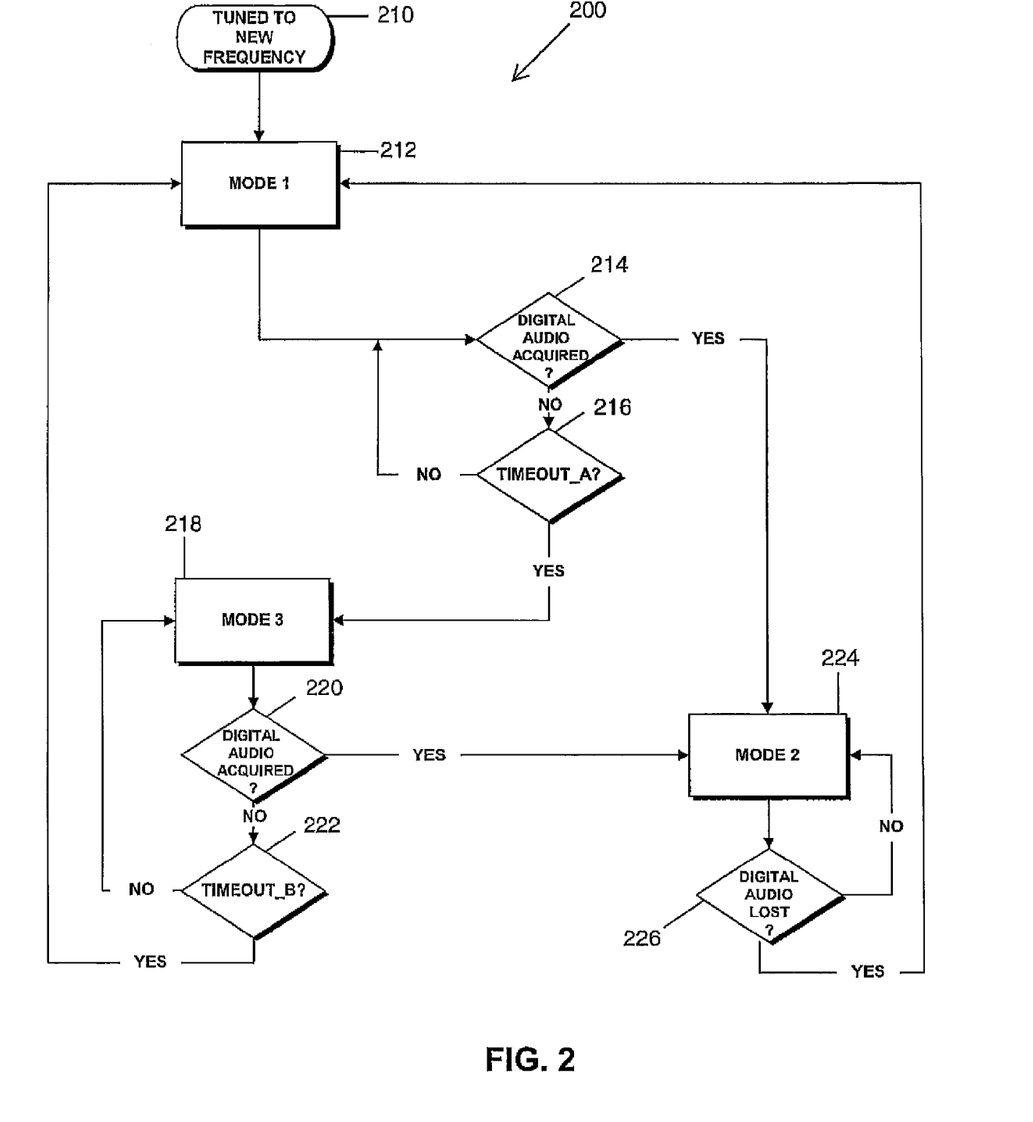
FIG. 2 is a flow chart illustrating operation of the receiver in the different operating modes.

FIG. 2 is a flow chart 200 illustrating operation of the receiver in the different operating modes. The flow chart 200 illustrates examples of situations in which the different operating modes are used. For example, when the receiver 100 (in FIG. 1) is tuned to a new frequency as shown at step 210, the receiver 100 is configure to operate in the first operating mode as shown at step 212. In the first operating mode, decision block 212 checks whether a digital signal component can be received. If no digital signal component can be received for a predetermined amount of time, such as for example, timeout period A in decision block 213, the receiver 100 changes the operating mode to the third operating mode as shown at step 218.

In the third operating mode, the receiver 300 operates as described with reference to FIG. 4. In a moving vehicle, the availability of digital broadcast signal components may vary. Decision block 220 checks whether a digital broadcast signal becomes available. If no digital signal component can be acquired for a timeout B, as shown in decision block 222, the receiver 300 returns to the first operating mode as described with reference to FIG. 1.

If it is determined in decision block 214 that a digital signal could be acquired, the receiver 100 switches to the second operating mode as shown at step 224. When operating in the second operating mode, the digital reception path 106 is used as shown in FIG. 3. Decision block 226 checks whether a digital broadcast signal can still be received. If a digital broadcast signal cannot be received, the digital component is lost and the receiver 100 returns to the first operating mode as shown at step 212. If the digital signal was not lost, the receiver 300 stays in the second operating mode. The control or operating mode selection unit 128 ensures that the loss of digital audio output is detected fast enough to avoid noticeable degradation of the analog reception quality because the analog broadcast signal is received via the first tuner 102 at this point. The control unit configures the receiver 100 in the first operating mode so that the analog broadcast signal is received via the second tuner 110 with optimized performance. In this case, background reception is interrupted. If the digital audio output does not become available, the control unit changes the receiver configuration to the third operating mode after a fixed amount of time, such as for example timeout period A in decision block 216.

Figure 5:
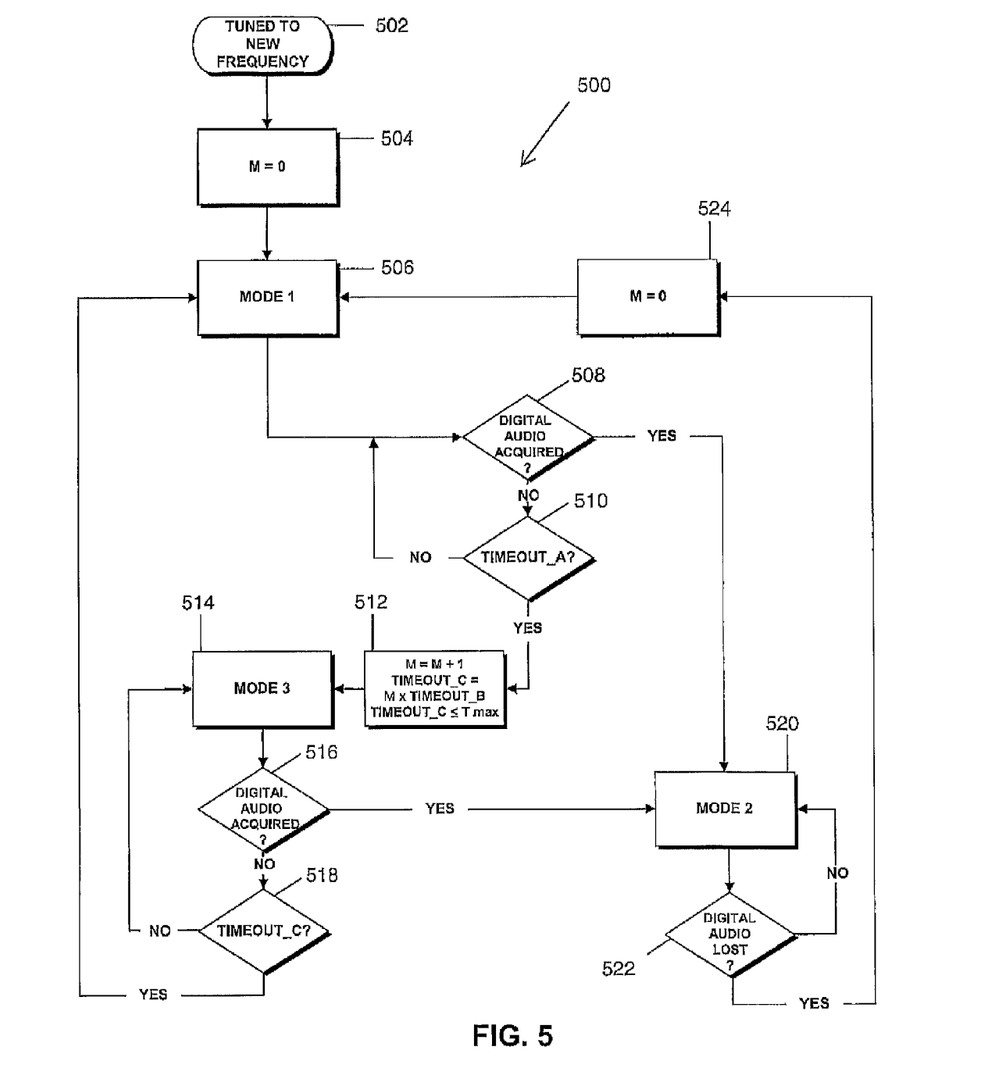
FIG. 5 is a flow chart illustrating operation of another example of the different operating modes.

FIG. 5 is a flow chart illustrating operation of another example of the different operating modes. The example shown in FIG. 5 may be used when the time for collecting background data in the third operating mode should be increased. If there is no digital signal component available or when the reception quality of the digital broadcast signal is not good enough for the audio output, the rapid switching from the third operating mode to the first operating mode and back to the third operating mode should be avoided because every switch from the third operating mode to the first operating mode interrupts the background reception. When the receiver is tuned to a new frequency at step 502, a parameter M may be set to zero as shown in step 504. The parameter M indicates the number of unsuccessful attempts by the receiver 400 to receive a digital audio component when operating in the third operating mode, and when changing to the first operating mode in order to look for digital signal components. Decision block 508 checks whether digital components can be received. If digital components cannot be received for a predetermined amount of time, such as timeout period A in decision block 510, the value of M is increased and a new timeout period C can be calculated at step 512. The timeout period C may be calculated using the timeout period B shown in FIG. 2 multiplied by the factor M. At step 518, the timeout period C may be used for changing the operating mode to the first operating mode when no digital signal component can be acquired.

To illustrate by example, decision block 508 may check for the first time and find that no digital audio could be detected. In this first time through, the timeout period B corresponds to timeout period C. When the receiver 400, after operating in the third operating mode returns to the first operating mode and still no digital audio is detected at decision block 508, M is incremented resulting in a larger value of timeout period C. In this way, decision block 518 provides the receiver with a longer waiting period before returning to the first operating mode and checking the availability of received digital data. The value of timeout period C may be increased until a maximum timeout $T_{max}$ is attained. As can be seen from the example flowchart in FIG. 5, the time the receiver stays in the third operating mode supporting the background reception is increased in accordance with the unsuccessful attempts to decode an audio output of the digital broadcast signal while being configured in the first operating mode. As soon as the receiver has demodulated and decoded the audio signal of the digital broadcast signal once, the timeout is reset to its initial value by setting M to zero as indicated in step 524.

Figure 6:
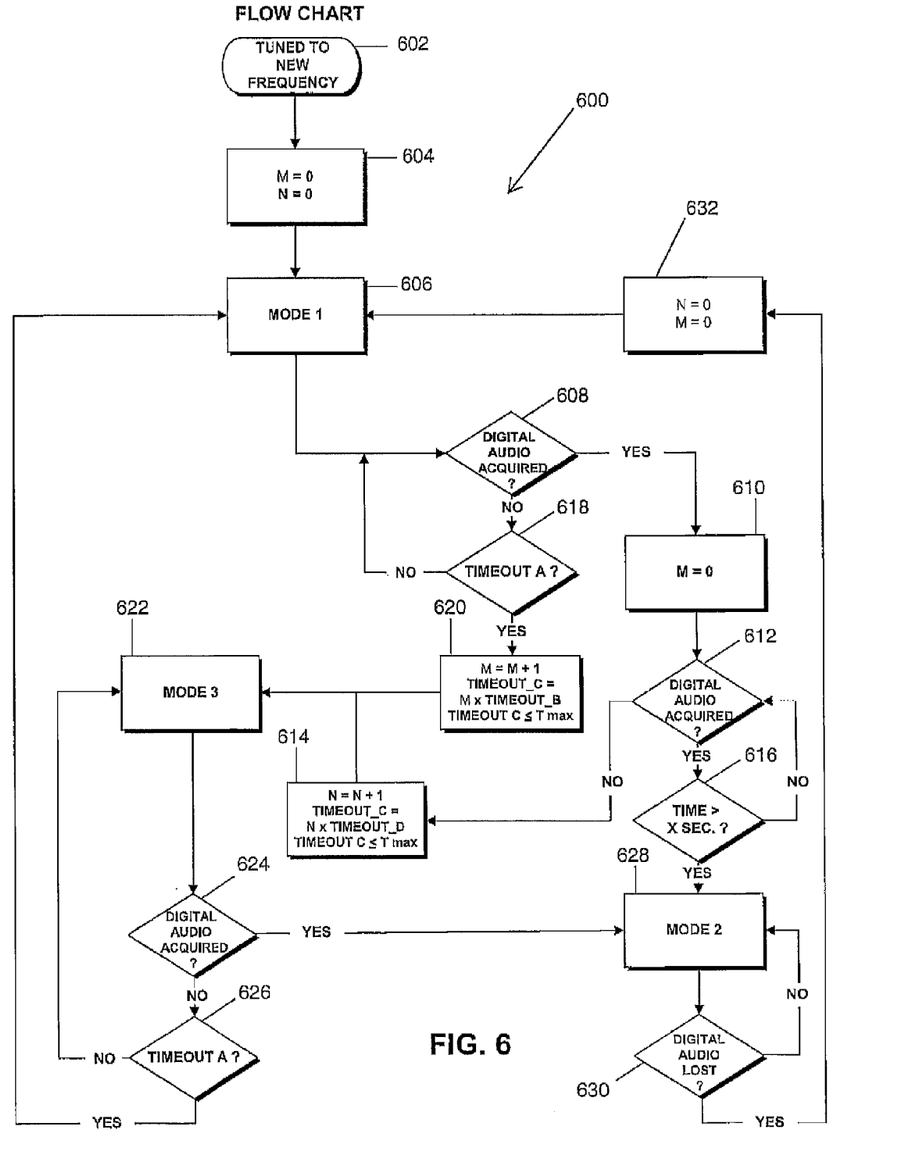
FIG. 6 is a flow chart illustrating operation of another example of the different operating modes.

FIG. 6 is a flowchart illustrating operation of another example of the different operating nodes. The flowchart in FIG. 6 illustrates operation in, for example, reception situations where the reception quality of the digital broadcast signal does not allow continuous demodulation and decoding of the corresponding audio signal resulting in a frequent blending between the audio output of the digital and the analog reception path. In such situations, it may be desirable to force the receiver to output the audio signal of the analog reception path for longer periods of time. To achieve this, the control unit increases the time the receiver is configured in the third operating node every time the receiver blends back from the digital audio output to the analog audio output within a predetermined amount of time X.

Referring to FIG. 6, at step 602, the receiver is tuned to a new frequency. At step 604, parameters M and N are set to zero, and the receiver operates in the first operating mode in step 606. If at decision block 608, a digital signal component was detected, M is set to zero at step 610. Decision block 612 checks whether a digital audio component can be received. If a digital audio component cannot be received, the receiver continues at step 614 where the parameter N is incremented leading to an increased timeout C. If at decision block 612, digital audio components were detected, decision block 616 checks whether the digital component was received for longer than X seconds. If the digital audio components were not received for longer than X seconds, the receiver returns to decision block 612. If the digital audio component was received for longer than X seconds, the receiver switches its operating mode to the second operating mode as indicated in step 628. The example described with reference to FIG. 6 provides further improved performance of the background reception and lead to a smoother sound impression, as excessive mode-switching is avoided.

Figure 7:
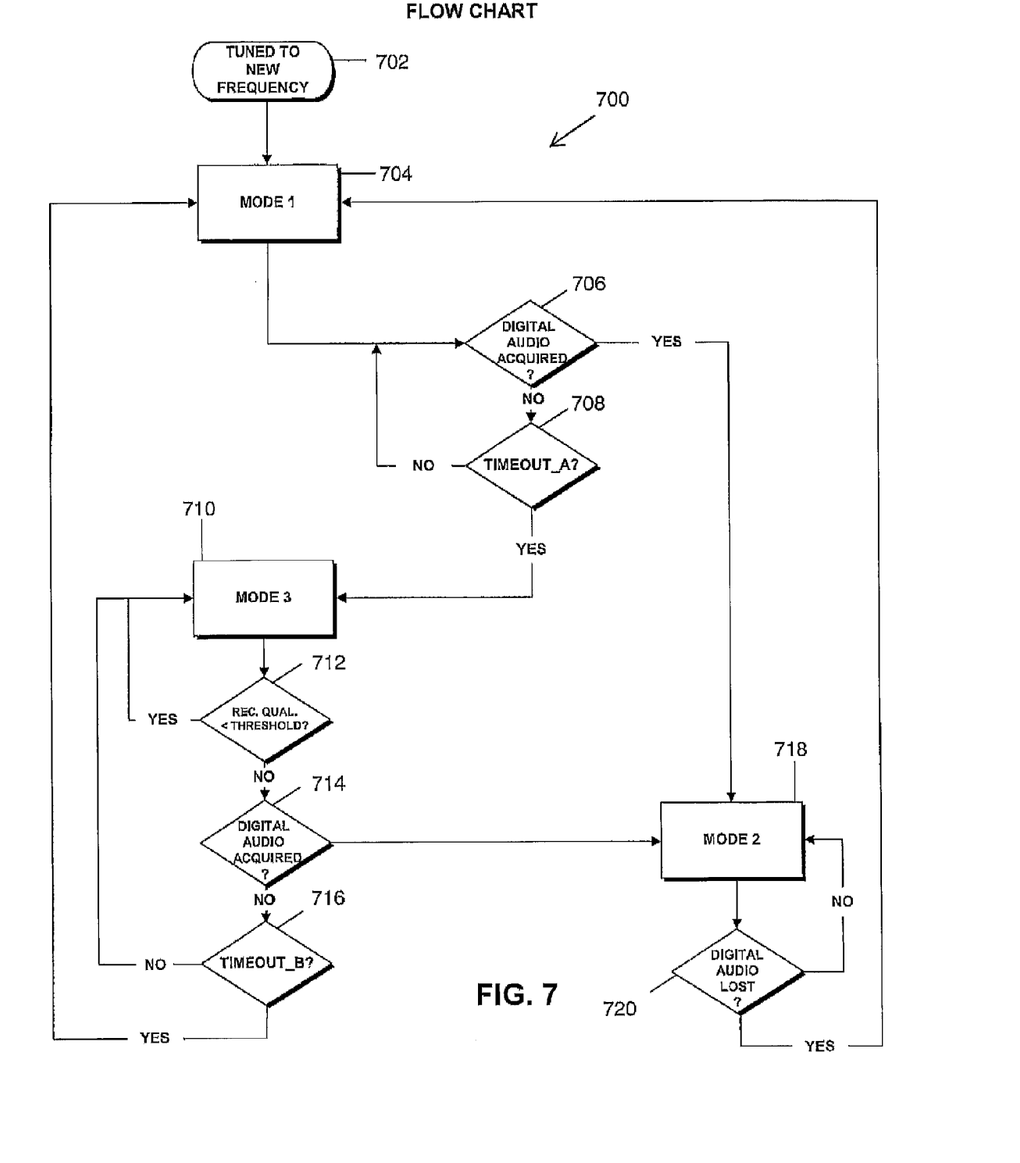
FIG. 7 is a flow chart illustrating operation of another example of the different operating modes.

FIG. 7 is a flow chart illustrating operation of another example of the different operating modes. In the example shown in FIG. 7, the reception quality of the desired program station is checked while the receiver is configured in the third operating mode. When the receiver 100 (in FIG. 1) is tuned to a new frequency as shown at step 702, the receiver 100 is configured to operate in the first operating mode as shown at step 704. In the first operating mode, decision block 706 checks whether a digital signal component can be received. If no digital signal component can be received for a predetermined amount of time, such as for example, timeout period A in decision block 708, the receiver 100 changes the operating mode to the third operating mode as shown at step 710. In the third operating mode, decision block 712 checks whether the receiving quality is lower than a predetermined threshold. If the received signal quality is low, the system stays in the third operating mode, since looking for digital audio components would not be useful when the signal quality is not sufficient to properly demodulate the digital broadcast signals. If the signal quality is deemed sufficient in decision block 712, decision block 714 checks for digital audio and steps 718 and decision blocks 716 and 718 operate as described above with reference to FIG. 2.

In another example (not shown) it is possible to configure the receiver by providing an additional signal processing path or signal processing unit to allow background reception of the digital broadcast signals as well. It should be understood that all the different examples described above can be combined with each other.

It will be understood, and is appreciated by persons skilled in the art, that one or more processes, sub-processes, or process steps described in connection with FIGS. 1-7 may be performed by hardware and/or software. If the process is performed by software, the software may reside in software memory (not shown) in a suitable electronic processing component or system such as, one or more of the functional components or modules schematically depicted in FIGS. 1, 3 & 4. The software in software memory may include an ordered listing of executable instructions for implementing logical functions (that is, "logic" that may be implemented either in digital form such as digital circuitry or source code or in analog form such as analog circuitry or an analog source such an analog electrical, sound or video signal), and may selectively be embodied in any computer-readable (or signal-bearing) medium for use by or in connection with an instruction execution system, apparatus, or device, such as a computer-based system, processor-containing system, or other system that may selectively fetch the instructions from the instruction execution system, apparatus, or device and execute the instructions. In the context of this disclosure, a "computer-readable medium" and/or "signal-bearing medium" is any means that may contain, store, communicate, propagate, or transport the program for use by or in connection with the instruction execution system, apparatus, or device. The computer readable medium may selectively be, for example, but is not limited to, an electronic, magnetic, optical, electromagnetic, infrared, or semiconductor system, apparatus, device, or propagation medium. More specific examples, but nonetheless a non-exhaustive list, of computer-readable media would include the following: an electrical connection (electronic) having one or more wires, a portable computer diskette (magnetic), a RAM (electronic), a read-only memory "ROM" (electronic), an erasable programmable read-only memory (EPROM or Flash memory) (electronic), an optical fiber (optical), and a portable compact disc read-only memory "CDROM" (optical). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The foregoing description of an implementation has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed is:

1. A method for controlling a radio receiver having two tuners, the radio receiver receiving a hybrid signal containing digital and analog broadcast signal components, the method comprising:
   selecting between at least the following operating modes of the receiver:
      a first operating mode in which both tuners are tuned to the same broadcast hybrid signal, one of the tuners being configured for receiving the digital broadcast signal, the other tuner configured for receiving the analog broadcast signal;
      a second operating mode in which one of the tuners receiving the digital broadcast signal is the operating tuner and the other tuner is a search and check tuner; and
      a third operating mode in which one of the tuners receiving the analog broadcast signal is the operating tuner and the other tuner is a search and check tuner; and
   receiving the hybrid signal and controlling the two tuners in accordance with the selected operating mode of the receiver.

2. The method of claim 1 where the first operating mode is selected when the receiver was tuned to a new frequency in order to check whether a digital broadcast signal component can be received.

3. The method of claim 1 further comprising:
   detecting whether digital broadcast signal components can be received;
   if digital broadcast signal components can be received, selecting the second operating mode; and
   if no digital broadcast signal components can be received, selecting the third operating mode.

4. The method of claim 1 further comprising:
   when the receiver works in the third operating mode, checking whether digital broadcast signals can be received; and
   if digital broadcast signals can be received, changing the operating mode from the third operating mode to the second operating mode.

5. The method of claim 1 further comprising:
   when working in the third operating mode, after a predetermined timeout B, changing to the first operating mode and checking whether a digital broadcast signal has become available.

6. The method of claim 1 further comprising, when in the first operating mode:
   demodulating and decoding the analog broadcast signal;
   demodulating and decoding the digital broadcast signal; and changing to the digital broadcast signal for an audio output as soon as the demodulating and decoding is finished and the digital broadcast signal is ready to be output.

7. The method of claim 5 where, when the receiver is operating in the third operating mode, changing to the first operating mode and, after a predetermined timeout C greater than timeout B, checking whether a digital broadcast signal has become available.

8. The method of claim 7 where the timeout C is increased with the number of unsuccessful attempts to detect digital broadcast signals.

9. The method of claim 1 where:
when a digital broadcast signal is detected, checking whether the detected digital broadcast signal can be detected for a predetermined period of time X;
if the detected digital broadcast signal can be detected for a predetermined period of time X, the operating mode of the receiver is changed to the second operating mode; and
if the detected digital. broadcast signal can not be detected for a predetermined period of time X, the operating mode of the receiver is the third operating mode.

10. The method of claim 9 where when the receiver is working in the third operating mode, the timeout C is increased with the number of attempts to detect a digital broadcast signal longer than the predetermined period of time X.

11. The method of claim 1 further comprising:
when the receiver is working in the third operating mode, checking the quality of the received signal; and
if the quality is below a predetermined threshold value, leaving the receiver in the third operating mode.

12. The method of claim 1 further comprising:
when the receiver works in the second operating mode and a loss of the digital broadcast signal is detected, using an audio output of the analog broadcast signal from the tuner that was previously working as a search and check tuner.

13. The method of claim 12 further comprising:
when the digital broadcast signal does not become available again, changing the operation of the receiver to the third operating mode after a predetermined amount of time.

14. The method of claim 8 where the timeout C is reset to its starting value when a digital broadcast signal has once been demodulated and decoded.

15. The method of claim 8 where the period of time X is reset to its initial value when the receiver has output the audio signal of the digital broadcast signal longer than the predetermined-period of time X.

16. The method of claim 1 further comprising:
when operating in the third operating mode for the signal of the tuner working as the search and check tuner, processing a digital broadcast signal in order to collect information from other digital broadcast signals.

17. The method of claim 1 where the digital and analog broadcast signal components are transmitted at the same frequency.

18. A radio receiver configured for receiving a hybrid signal containing digital and analog broadcast signal components, comprising:
a first tuner adapted to receive the digital and the analog broadcast signals:
a second tuner adapted to receive the analog broadcast signal;
at least one antenna for receiving the hybrid signal;
at least one signal processing unit for demodulating and decoding the analog and digital broadcast signals;
an operating mode selection unit for controlling the two tuners to select an operating mode of the receiver from between at least the following operating modes:
a first operating mode in which both tuners are tuned to the same broadcast hybrid signal, one of the tuners being configured for receiving the digital broadcast signal, the other tuner receiving the analog broadcast signal;
a second operating mode in which one of the tuners receiving the digital broadcast signal is the operating tuner and the other tuner is a search and check tuner; and
a third operating mode in which one of the tuners receiving the analog broadcast signal is the operating tuner and the other tuner is a search and check tuner.

19. The radio receiver of claim 18 further comprising:
a first analog-to-digital converter for receiving the signals from the first tuner; and
a second analog-to-digital converter for receiving the signals from the second tuner.

20. The radio receiver of claim 18 where the signal processing unit comprises:
an analog reception processing module;
a digital reception processing module; and
a background reception processing module.

21. The radio receiver of claim 18 further comprising:
switching or blending module for selecting either the signal processed by the analog reception processing module or the digital reception processing module for the audio output.

* * * * *

UNITED STATES PATENT AND TRADEMARK OFFICE
CERTIFICATE OF CORRECTION

| | | |
|---|---|---|
| PATENT NO. | : 8,131,235 B2 | |
| APPLICATION NO. | : 12/013333 | |
| DATED | : March 6, 2012 | |
| INVENTOR(S) | : Becker et al. | |

It is certified that error appears in the above-identified patent and that said Letters Patent is hereby corrected as shown below:

At column 1, line 8, "...RECEIVE..." should be changed to -- RECEIVER --

At column 3, line 34, "...processing 124..." should be changed to -- processing module 124 --

At column 4, line 13, "the receiver is..." should be changed to -- the receiver 100 is --

At column 4, line 17, "...ADC 108..." should be changed to -- ADC1 108 --

At column 4, line 21, "...ADC114..." should be changed to -- ADC2 114 --

At column 4, lines 37–38, "...the receiver 100 is..." should be changed to -- the receiver 100 (FIG. 1) is --

At column 4, lines 47–48, "...the second ADC 114..." should be changed to -- the second ADC2 114 --

At column 4, line 50-51, "...the first ADC 108..." should be changed to -- the first ADC1 108 --

At column 4, line 63, "...the receiver 100, 300..." should be changed to -- the receiver 100 in FIG. 1, 300 in FIG. 3 --

At column 5, line 16, "...is configure..." should be changed to -- is configured --

At column 5, line 21, "...decision block 213..." should be changed to -- decision block 216 --

At column 5, line 29, "...a timeout B..." should be changed to -- a timeout period B --

At column 5, line 30, "...first operating mode as described" should be changed to -- first operating mode as shown at step 212 and --

Signed and Sealed this
Twenty-ninth Day of January, 2013

David J. Kappos
*Director of the United States Patent and Trademark Office*

CERTIFICATE OF CORRECTION (continued)
U.S. Pat. No. 8,131,235 B2

At column 5, line 41, "...in the second operating mode. The..." should be changed to -- in the second operating mode as shown at step 224. The --

At column 5, line 54, "...is a flowchart illustrating..." should be changed to -- is a flowchart 500 illustrating --

At column 6, line 12, "first operating mode when..." should be changed to -- first operating mode as shown at step 506 when --

At column 6, line 27, "third operating mode supporting..." should be changed to -- third operating mode as shown at step 514 supporting --

At column 6, line 34, "...is a flowchart illustrating..." should be changed to -- is a flowchart 600 illustrating --

At column 6, line 35, "...The flowchart in" should be changed to -- The flowchart 600 in --

At column 6, line 56, "...an increased timeout C..." should be changed to -- an increased timeout period C --

At column 7, line 1, "...is a flow chart illustrating..." should be changed to -- is a flowchart 700 illustrating --